United States Patent
Lewis (10) Patent No.: US 9,912,307 B2
(45) Date of Patent: Mar. 6, 2018

(54) DECOUPLING LOOP FOR REDUCING UNDESIRED MAGNETIC COUPLING BETWEEN INDUCTORS, AND RELATED METHODS AND DEVICES

(71) Applicant: RF Micro Devices, Inc., Greensboro, NC (US)

(72) Inventor: Timothy D. Lewis, Cedar Rapids, IA (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 15/074,121

(22) Filed: Mar. 18, 2016

(65) Prior Publication Data

US 2016/0276097 A1    Sep. 22, 2016

Related U.S. Application Data

(60) Provisional application No. 62/135,209, filed on Mar. 19, 2015.

(51) Int. Cl.

| | |
|---|---|
| *H03F 9/02* | (2006.01) |
| *H03F 3/21* | (2006.01) |
| *H01F 17/00* | (2006.01) |
| *H01F 27/28* | (2006.01) |
| *H01F 27/38* | (2006.01) |

(52) U.S. Cl.
CPC ......... *H03F 3/211* (2013.01); *H01F 17/0006* (2013.01); *H01F 27/2804* (2013.01); *H01F 27/289* (2013.01); *H01F 27/38* (2013.01); *H03F 2200/537* (2013.01)

(58) Field of Classification Search
CPC ....................................... H03F 9/02
USPC .................................. 330/170, 166
See application file for complete search history.

(56) References Cited

U.S. PATENT DOCUMENTS

| | | | | |
|---|---|---|---|---|
| 5,539,283 | A  * | 7/1996 | Piejak | H05B 41/24 313/492 |
| 6,603,646 | B2 * | 8/2003 | Anthony | H01G 4/012 257/E23.079 |
| 7,248,046 | B2 * | 7/2007 | Alvarez | G01R 33/441 324/300 |
| 2008/0157772 | A1 * | 7/2008 | Okamoto | G01R 33/3415 324/322 |

(Continued)

*Primary Examiner* — Henry Choe
(74) *Attorney, Agent, or Firm* — Withrow & Terranova, P.L.L.C.

(57) ABSTRACT

Devices and related methods use a decoupling loop near closely spaced inductors that couples to each inductor and adds an additional coupling path between them, canceling the effects of the direct coupling between the inductors. When two inductors are close enough that undesired magnetic coupling between the inductors is possible, a decoupling loop adjacent the inductors is added that is configured to cancel the undesired magnetic coupling between the inductors. The decoupling loop is positioned, with respect to the first and second inductors, such that coupling between the decoupling loop and the first inductor induces a decoupling loop current around the decoupling loop and induces a second induced current on the second inductor that is equal and in an opposite direction to a first induced current on the second inductor caused by the first inductor. The undesired magnetic coupling between the conductors is reduced, and may even be totally cancelled.

20 Claims, 10 Drawing Sheets

(56) References Cited

U.S. PATENT DOCUMENTS

| | | | |
|---|---|---|---|
| 2011/0006872 A1* | 1/2011 | Nazarian | H01F 17/0006 336/84 C |
| 2011/0109306 A1* | 5/2011 | Leeb | G01R 31/3277 324/228 |
| 2012/0153957 A1* | 6/2012 | Okamoto | G01R 33/3415 324/322 |
| 2013/0307613 A1* | 11/2013 | Tham | H03B 1/04 327/551 |
| 2016/0276097 A1* | 9/2016 | Lewis | H03F 3/211 |

* cited by examiner

| INDUCTOR Q | | |
|---|---|---|
| CIRCUIT | B8 | B20 |
| ORIGINAL | 20.5 | 25.1 |
| WITH LOOPS | 20.3 | 23.8 |

*FIG. 9C*

DECOUPLING LOOP FOR REDUCING UNDESIRED MAGNETIC COUPLING BETWEEN INDUCTORS, AND RELATED METHODS AND DEVICES

RELATED APPLICATIONS

This application claims the benefit of U.S. provisional patent application No. 62/135,209, filed Mar. 19, 2015, entitled "DECOUPLING LOOP," the disclosure of which is hereby incorporated herein by reference in its entirety.

FIELD OF THE DISCLOSURE

The present disclosure relates to a decoupling loop for reducing undesired magnetic coupling, particularly undesired magnetic coupling between printed inductors on integrated circuit chips for use in a mobile device, such as a power amplifier.

BACKGROUND

Many integrated circuit chips contain multiple circuits embedded in the chips and the size of these integrated circuit chips have grown smaller and smaller over time. This results in an increased density. For example, with respect to power amplifiers used in mobile devices, there is need for increased band density. As the band density of the power amplifier modules increases, undesirable magnetic coupling between structures, such as printed inductors, is getting more difficult to avoid. This undesired magnetic coupling can be detrimental to isolation, stability, impedance, and other factors. Ground shielding inductors reduces their coupling, but it significantly lowers the inductor quality (Q) factor. A ground wall between the inductors is another option, but it is often not sufficient. It is therefore desirable to have a more effective way to decouple these inductors and allow for reduced space between inductors, making the layout more compact.

SUMMARY

Embodiments disclosed herein include devices having reduced magnetic coupling between inductors, and related methods. Placing a conducting loop near closely spaced inductors can decouple inductors effectively. The decoupling loop couples to each inductor and adds an additional coupling path between them, canceling the effects of the direct coupling between the inductors.

A device having reduced magnetic coupling between inductors comprises a first inductor having a first inductance and a second inductor having a second inductance. The first and second inductors may be close enough to each other that an undesired magnetic coupling between the first inductor and second inductor is possible. The device includes a decoupling loop adjacent the first and second inductors. The decoupling loop is configured to cancel the undesired magnetic coupling between the first and second inductors. In one embodiment, the first inductor is positioned near the second inductor such that a current on the first inductor induces a first induced current on the second inductor. The decoupling loop is positioned with respect to the first and second inductors such that coupling between the decoupling loop and the first inductor induces a decoupling loop current around the decoupling loop and induces a second induced current on the second inductor that is equal and in an opposite direction to the first induced current on the second inductor. In this manner, the undesired magnetic coupling between the conductors is reduced, and may even be totally cancelled in some embodiments.

In another embodiment, a power amplifier die having two differential power amplifiers is disclosed. The power amplifier die comprises a first transformer and a second transformer positioned side by side, wherein there is an undesired magnetic coupling between the first transformer and second transformer. The power amplifier die further comprises a decoupling loop adjacent the first and second transformers, the decoupling loop configured to cancel the undesired magnetic coupling between the first and second transformer. In one embodiment, the first transformer is positioned near the second transformer such that a current on the first transformer induces a first induced current on the second transformer. The decoupling loop is positioned with respect to the first and second transformers such that coupling between the decoupling loop and the first transformer induces a decoupling loop current around the decoupling loop and induces a second induced current on the second transformer that is equal and in an opposite direction to the first induced current on the second transformer.

In another embodiment, a method of reducing undesired magnetic coupling between inductors in a device is disclosed. The method comprises disposing a first inductor having a first inductance on a first layer of a device and disposing a second inductor having a second inductance on the first layer, wherein the second inductor is near enough the first inductor that an undesired magnetic coupling is possible between the first inductor and second inductor. The method further comprises placing a decoupling loop adjacent the first and second inductors, wherein the decoupling loop is configured to cancel the undesired magnetic coupling between the first and second inductors. In one embodiment, the second inductor is disposed near enough the first inductor that a current on the first inductor induces a first induced current on the second inductor. The decoupling loop is placed with respect to the first and second inductors such that coupling between the decoupling loop and the first inductor induces a decoupling loop current around the decoupling loop and induces a second induced current on the second inductor that is equal and in an opposite direction to the first induced current on the second inductor.

In this manner, the undesired magnetic coupling between the conductors is reduced, and may even be totally cancelled in some embodiments.

Those skilled in the art will appreciate the scope of the present disclosure and realize additional aspects thereof after reading the following detailed description in association with the accompanying drawings.

BRIEF DESCRIPTION OF THE DRAWINGS

The accompanying drawing figures incorporated in and forming a part of this specification illustrate several aspects of the disclosure, and together with the description serve to explain the principles of the disclosure.

FIG. 78 is a graph that illustrates a simulated dip in performance of the two transformers in FIG. 6B without a decoupling loop due to magnetic coupling between the two transformers.

DETAILED DESCRIPTION

As the band density of devices, such as power amplifier modules increases, undesirable magnetic coupling between printed inductors is getting more difficult to avoid. This can be detrimental to isolation, stability, impedance, and other factors. Ground shielding inductors reduces their coupling, but it significantly lowers the inductor Q factor. A ground wall between the inductors is a better option, but it is often not sufficient.

A properly placed conducting loop can decouple the closely placed inductors effectively. Decoupling loops, as disclosed herein, couple to each inductor and add an additional coupling path between them, canceling the effects of the direct coupling between the inductors.

A device having reduced magnetic coupling between inductors comprises a first inductor having a first inductance and a second inductor having a second inductance. The first and second inductors may be close enough to each other that an undesired magnetic coupling between the first inductor and second inductor is possible. The device includes a decoupling loop adjacent the first and second inductors. The decoupling loop is configured to cancel the undesired magnetic coupling between the first and second inductors. In one embodiment, the first inductor is positioned near the second inductor such that a current on the first inductor induces a first induced current on the second inductor. The decoupling loop is positioned with respect to the first and second inductors such that coupling between the decoupling loop and the first inductor induces a decoupling loop current around the decoupling loop and induces a second induced current on the second inductor that is equal and in an opposite direction to the first induced current on the second inductor. In this manner, the undesired magnetic coupling between the conductors is reduced, and may even be totally cancelled, in some embodiments.

Figure 1A:
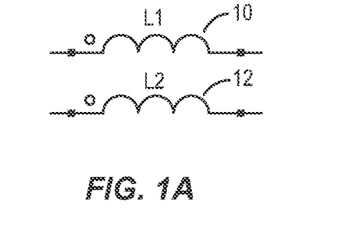
FIG. 1A is a schematic diagram of two inductors having undesirable coupling.

FIG. 1A is a schematic diagram of two inductors having undesirable coupling. A first inductor 10 and a second inductor 12 have inductances L1 and L2, respectively. The first inductor 10 and the second inductor 12, when located close to each other, have a coupling factor K12, which may be undesired.

Figure 1B:
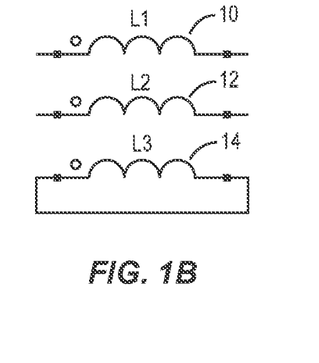
FIG. 1B is a schematic diagram of the same two inductors in FIG. 1A with an additional exemplary inductor with its ends shorted together, according to one embodiment.

FIG. 1B is a schematic diagram of the same two inductors in FIG. 1A with an additional exemplary inductor with its ends shorted together, according to one embodiment. In essence, FIG. 1B is the same circuit with an additional inductor 14 having an inductance L3. The ends of the additional inductor 14 are shorted together to create a self-contained current loop. The self-contained current loop formed by the additional inductor 14 couples to inductors 10 and 12 with coupling factors K13 and K23, respectively. When K12=K13*K23, the inductors 10 and 12 are completely decoupled. The effective coupling factor between the inductors 10 and 12 becomes zero.

Figure 1C:
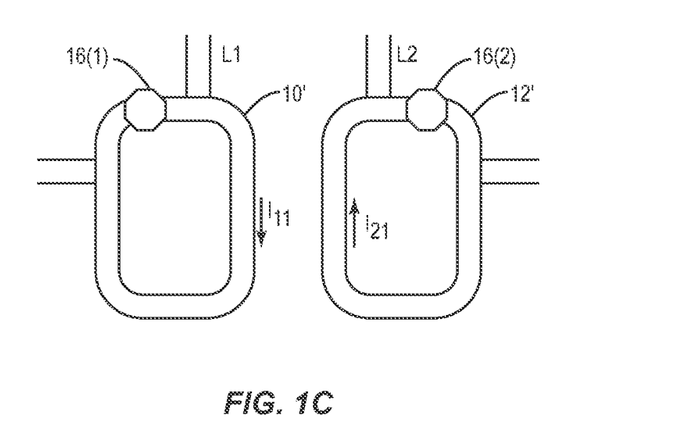
FIG. 1C is a schematic layout of the two inductors of FIG. 1A.
Figure 1D:
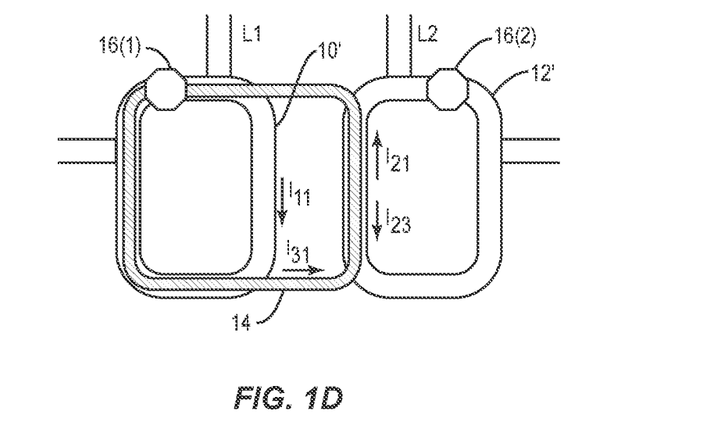
FIG. 1D is a schematic layout that corresponds to FIG. 1B where the additional inductor is shown as an exemplary current loop, according to one embodiment.

Referring now to FIGS. 1C and 1D, FIG. 1C is a schematic layout of the two inductors 10 and 12 of FIG. 1A. FIG. 1D is a schematic layout that corresponds to FIG. 1B where the additional inductor 14 is shown as an exemplary current loop, according to one embodiment.

In essence, FIGS. 1C and 1D are simple layout examples of FIGS. 1A and 1B Referring to FIG. 1C, the inductor 10' has an inductance L1. In one embodiment, the first inductor 10' may be part of a device, such as a printed circuit board, where the inductor 10' has a via 16(1) associated with it for connection to other structures in the device (not shown). The second inductor 12' has an inductance L2. In one embodiment, the second inductor 12' may be part of a device, such as a printed circuit board, where the second inductor 12' has a via 16(2) associated with it for connection to other structures in the device (not shown). When the first inductor 10' and the second inductor 12' are placed close together in the device, a current on the first inductor 10" (indicated by current label $I_{11}$) induces an induced current on the second inductor 12' (indicated by current label $I_{21}$), as shown in FIG. 1(C). This induced current $I_{21}$ may represent undesired coupling between first inductor 10' and second inductor 12'.

Referring now to FIG. 1D, a decoupling loop 14 may be used to reduce or eliminate this undesired coupling between the first inductor 10' and the second inductor 12'. In one embodiment, the first inductor 10' and the second inductor 12' may be disposed on a first layer of a device, and the decoupling loop 14 may be added on a different layer (above or below) of the device. In one embodiment, the decoupling loop 14 may be added adjacent to the inductors 10' and 12' on the same layer as one or both of the inductors 10' and 12'. Any layer (or multiple layers) of the device can be used for either inductor 10' and 12', and the decoupling loop 14 may be above, below, or adjacent to, one or both of the inductors 10' and 12'. Current labels illustrate how the decoupling loop 14 cancels the effects of inductor coupling in terms of induced current. Current on the first inductor 10' ($I_{11}$) induces a first induced current on the second inductor 12' ($I_{21}$), as shown in FIG. 1C. In FIG. 1D, the decoupling loop 14 is floating; it is not physically attached to either the first inductor 10' or the second inductor 12'. The decoupling loop 14 simply couples magnetically with the first inductor 10' and second inductor 12'. In one embodiment, the decoupling loop 14 is not grounded. Coupling between the first inductor 10' and the decoupling loop 14 induces a decoupling loop current ($I_{31}$) around the decoupling loop 14. The decoupling loop 14 then induces a second induced current ($I_{23}$) on the second inductor 12'. In one embodiment, the decoupling loop 14 is laid out such that the current it induces on the second inductor 12' ($I_{23}$) is equal in magnitude and opposite in direction to that of the first induced current ($I_{21}$). When K12=K13*K23, $I_{23}=I_{21}$, and the total induced current on the second inductor 12' becomes zero.

Figure 2A:
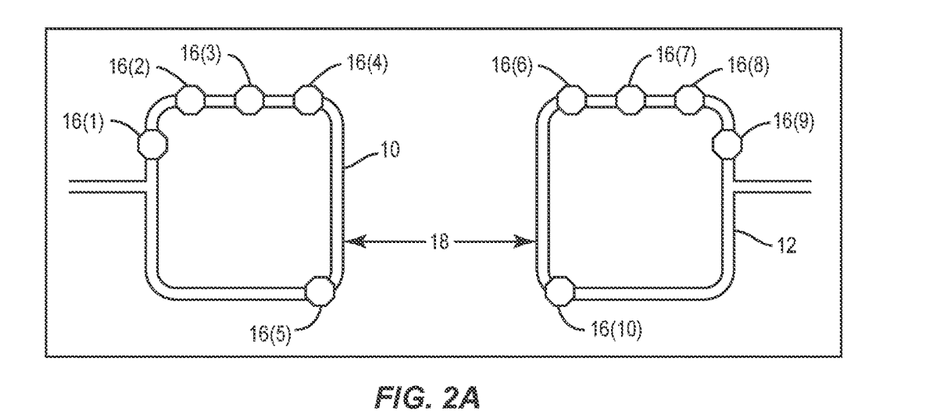
FIG. 2A is a schematic layout of two adjacent shunt inductors having a first distance separating the two adjacent shunt inductors.
Figure 2B:
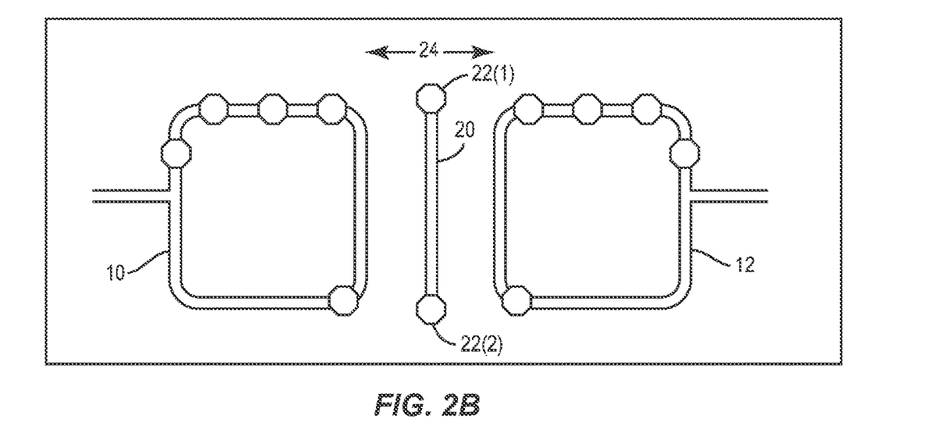
FIG. 2B is a schematic layout of the two adjacent shunt inductors having a ground wall in between, where a second, reduced distance separates the two adjacent shunt inductors.
Figure 2C:
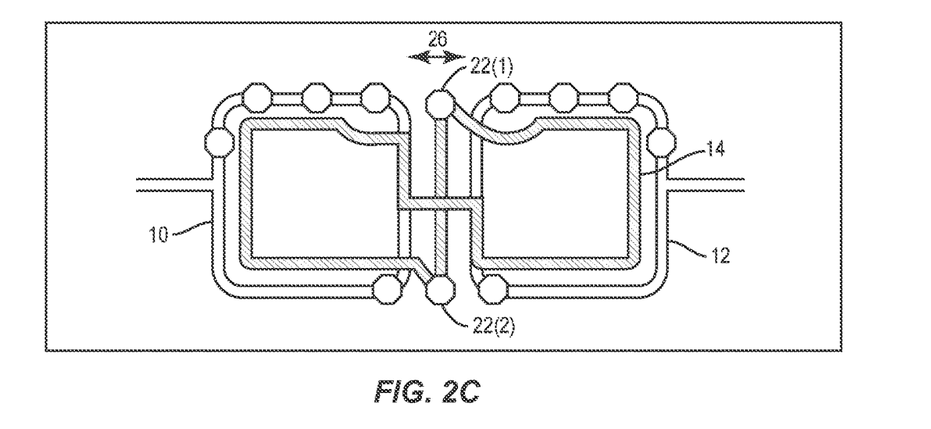
FIG. 2C is a schematic layout of two adjacent shunt inductors having an exemplary decoupling loop, where a third, further reduced distance separates the two adjacent shunt inductors, according to one embodiment.

With the use of a decoupling loop such as decoupling loop 14, inductors can be moved closer together without increasing the coupling between them. FIGS. 2A-2C show three ways to decouple two adjacent shunt inductors. FIG. 2A is a schematic layout of two adjacent shunt inductors having a first distance separating the two adjacent shunt inductors. FIG. 2B is a schematic layout of the two adjacent shunt inductors having a ground wall in between, where a second, reduced distance separates the two adjacent shunt inductors. FIG. 2C is a schematic layout of two adjacent shunt inductors having an exemplary decoupling loop, where a third, further reduced distance separates the two adjacent shunt inductors, according to one embodiment.

In each case of FIGS. 2A-2C, the distance between the inductors is the minimum needed to achieve at least 50 dB of isolation from DC to two GigaHertz (2 GHz). Referring to FIG. 2A, the inductor 10 has an inductance L1. In one embodiment, the first inductor 10 may be part of a device, such as a printed circuit board, where the inductor 10 has a plurality of vias 16(1)-16(5) associated with it for connection to other structures in the device (not shown). The second inductor 12 has an inductance L2. In one embodiment, the second inductor 12 may be part of a device, such as a printed circuit board, where the second inductor 12 has a plurality of vias 16(6)-16(10) associated with it for connection to other structures in the device (not shown). In one embodiment, the inductors 10 and 12 may spiral down through multiple layers of metal in a module comprising the inductors 10 and 12. The vias 16(1) through 16(10) may be between various layers of the inductors 10 and 12. With no decoupling structure (FIG. 2A), the inductors 10 and 12 need to be a minimum distance 18 apart in order to have acceptable isolation and not have undesired magnetic coupling. In one embodiment, the minimum distance 18 is approximately six hundred and forty micrometers (640) μm apart to have fifty (50) dB of isolation.

Referring now to FIG. 2B, the two inductors 10 and 12 have a ground wall 20 placed in between the first inductor 10 and the second inductor 12. The ground wall 20 may have associated vias 22(1) and 22(2) to connect it to ground or other structures in the device (not shown). For example, the vias 22(1) and 22(2) may be used to connect stacked metal traces to a ground. The ground wall 20 in FIG. 26 enables the inductor separation to be decreased to a minimum distance 24 in order to have acceptable isolation and not have undesired magnetic coupling. In one embodiment, the minimum distance 24 is approximately four hundred and twenty micrometers (420) μm apart to have fifty (50) dB of isolation.

FIG. 2C shows the first and second inductors 10 and 12 with an decoupling loop 14, indicated by the dashed path in FIG. 2C. In one embodiment, the first inductor 10 and the second inductor 12 may be disposed on a first layer of a device, and the decoupling loop 14 may be added on a different layer (above or below) of the device. In one embodiment, the decoupling loop 14 may be added adjacent to the inductors 10 and 12 on the same layer as one or both of the inductors 10 and 12. Any layer (or multiple layers) can be used for either inductor 10 and 12, and the decoupling loop 14 may be above, below, or adjacent to, the inductors 10 and 12. The decoupling loop 14 may operate as described above to reduce the undesired coupling between the inductors 10 and 12. The vias (seen in FIG. 2A) may be used to switch layers in one embodiment, so that the decoupling loop 14 can be routed in a figure eight shape, as seen in FIG. 2C, on a layer above or below a layer with the inductors 10 and 12, without running into itself. By using the decoupling loop 14, a third, further reduced minimum distance 26 between the two adjacent inductors 10 and 12 may be realized, and still have acceptable isolation and no undesired magnetic coupling. In one embodiment, the minimum distance 26 is approximately two hundred micrometers (200 μm) with fifty (50) dB of isolation.

Figure 3:
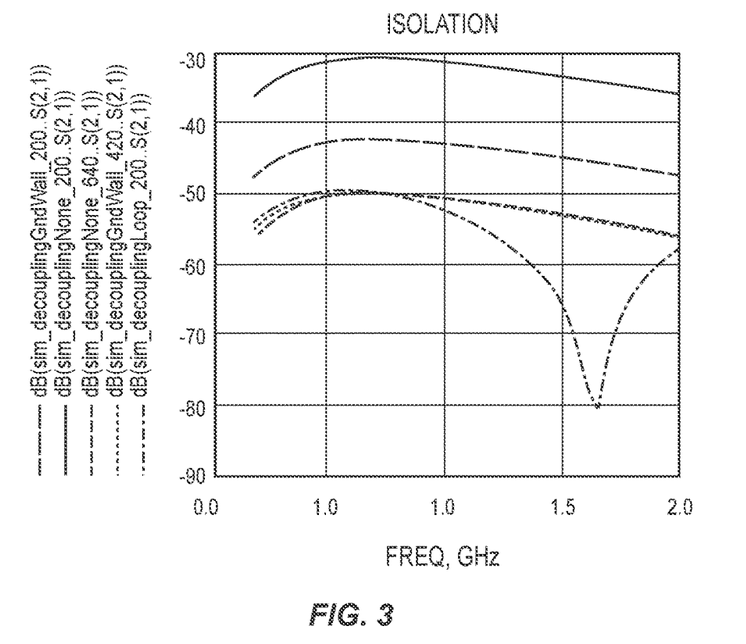
FIG. 3 is a graph that illustrates the inductor isolation over frequency for the layouts in FIGS. 2A-2C.

FIG. 3 is a graph that illustrates the inductor isolation over frequency for the layouts in FIGS. 2A-2C. FIG. 3 shows the inductor isolation over frequency for the inductors with no decoupling structures (FIG. 2A) the inductors with the ground wall (FIG. 2B), and the two inductors with the decoupling loop (FIG. 2C). Also shown is the isolation of the FIG. 2A and FIG. 2B cases but with inductor separation reduced to that of FIG. 2C (200 μm). The dotted and dashed line representing the decoupling loop example has a minimum at 1.65 GHz. At this point, the direct inductor coupling is equal to the coupling created by the decoupling loop 14

(K12=K13*K23). Above 1.65 GHz, the coupling path through the decoupling loop 14 is dominant. The equilibrium point can be moved up in frequency by shrinking the decoupling loop 14 to reduce the coupling between it and the inductors 10 and 12.

Figure 4:
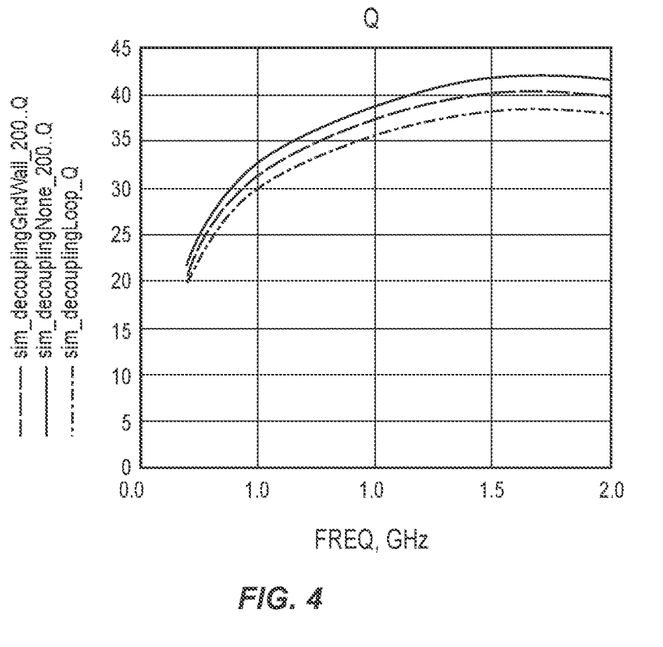
FIG. 4 is a graph that illustrates the quality factor (Q) of an inductor having the same distance of separation with another inductor for three situations: (1) having no decoupling loop (as in FIG. 2A), (2) having a ground wall (as in FIG. 2B), and (3) having an exemplary decoupling loop (as in FIG. 2C), according to an exemplary embodiment.

FIG. 4 is a graph that illustrates the quality factor (Q) of an inductor having the same distance of separation with another inductor for three situations: (1) having no decoupling loop 14 (as in FIG. 2A), (2) having a ground wall 20 (as in FIG. 2B), and (3) having an exemplary decoupling loop 14 (as in FIG. 2C), according to an exemplary embodiment. The tradeoff with adding decoupling structures is a slight drop in inductor Q factor. FIG. 4 compares the inductor Q at a two hundred micrometers (200 μm) separation with no decoupling structure, with the ground wall 20, and with the decoupling loop 14. At 1 GHz, the decoupling loop 14 improves isolation by twenty (20) dB and lowers the Q factor by only three (3).

Figure 5A:
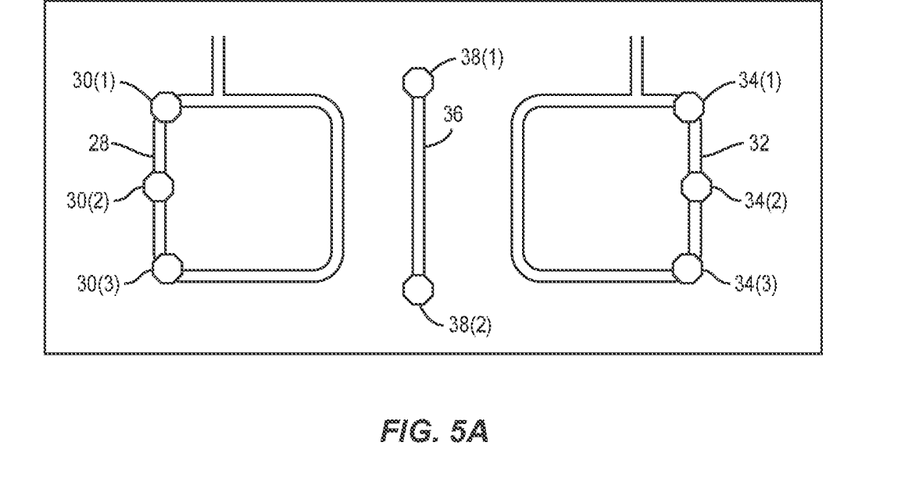
FIG. 5A is a schematic layout of another example of two adjacent shunt inductors having a ground wall in between, where the two adjacent shunt inductors do not use every layer of the device in which they are located.

FIG. 5A is a schematic layout of another example of two adjacent shunt inductors having a ground wall in between, where the two adjacent shunt inductors do not use every layer of the device in which they are located.

Figure 5B:
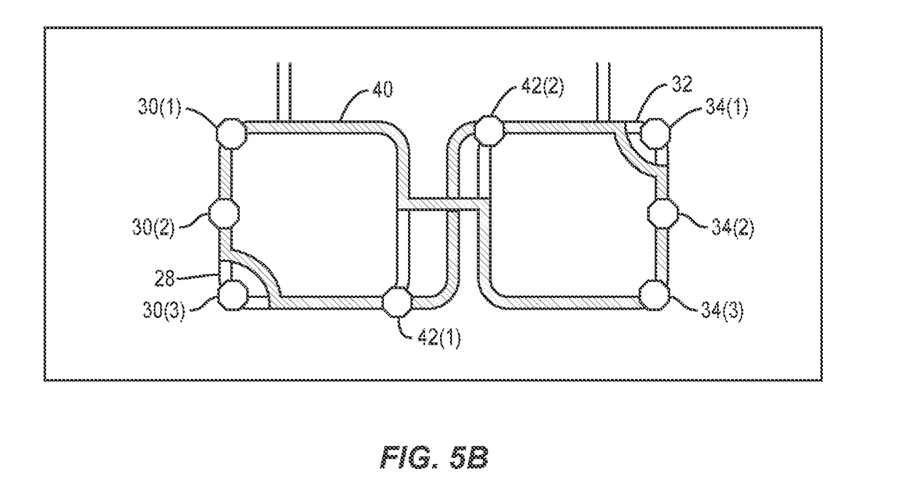
FIG. 5B is a schematic layout of the two adjacent shunt inductors in FIG. 5A with an exemplary decoupling loop, where the decoupling loop is routed directly below the inductors on a different layer of the device, according to an exemplary embodiment.

FIG. 5B is a schematic layout of the two adjacent shunt inductors in FIG. 5A with an exemplary decoupling loop, where the decoupling loop is routed directly below the inductors on a different layer of the device, according to an exemplary embodiment.

Referring to FIG. 5A, a first inductor 28 has an inductance L1. In one embodiment, the first inductor 28 may be part of a device, such as a printed circuit board, where the inductor 28 has a plurality of vias 30(1)-30(3) associated with it for connection to other structures in the device (not shown). The second inductor 32 has an inductance L2. In one embodiment, the second inductor 32 may be part of a device, such as a printed circuit board, where the second inductor 32 has a plurality of vias 34(1)-34(3) associated with it for connection to other structures in the device (not shown). The two inductors 28 and 32 have a ground wall 36 placed in between the first inductor 28 and the second inductor 32. The ground wall 36 may have associated vias 38(1) and 38(2) to connect it to ground or other structures in the device (not shown).

Again, as discussed above, in FIG. 5A, the inductors 28 and 32 are separated just enough to get fifty (50) dB of isolation between them. In one embodiment, the first inductor 28 and the second inductor 32 may be disposed on a first layer of a device. In this case, the inductors 28 and 32 do not use every layer of the device. Accordingly, as seen in FIG. 5B, a decoupling loop 40 can be routed directly below each inductor 28 and 32 on a separate layer of the device. In one embodiment, a portion of the decoupling loop 40 sits directly above or below the first inductor 28 and another portion of the decoupling loop 40 sits directly above or below the second inductor 32. This makes the decoupling loop 40 even more effective. In one embodiment, the decoupling loop 40 may have a plurality of vias 42(1)-42(2) associated with it for connection to ground or other structures in the device (not shown). The vias 42(1) and 42(2) may be used to switch layers so that the decoupling loop 40 can be routed in a figure eight pattern on a layer above or below a layer with tone or both of the inductors 28 and 32, without running into itself.

Figure 6A:
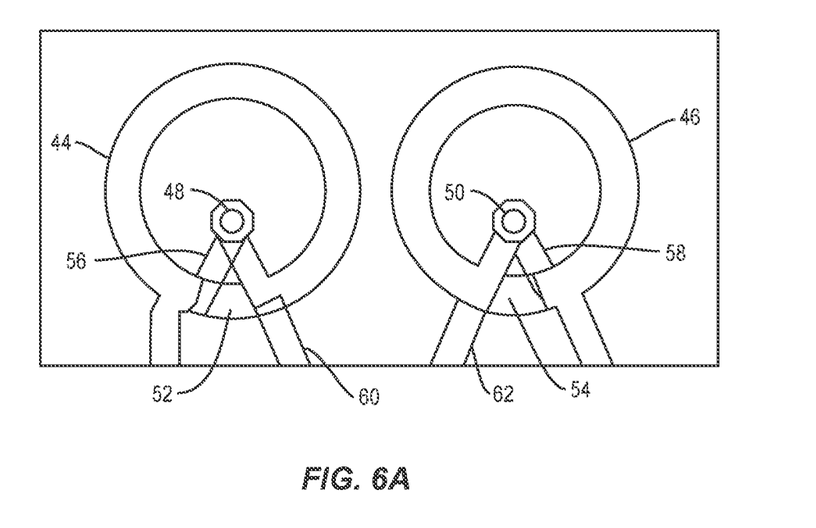
FIG. 6A is a schematic layout of a device having two differential power amplifiers on a single die, where two transformers are located side by side to each other such that there is magnetic coupling between the two transformers.
Figure 6B:
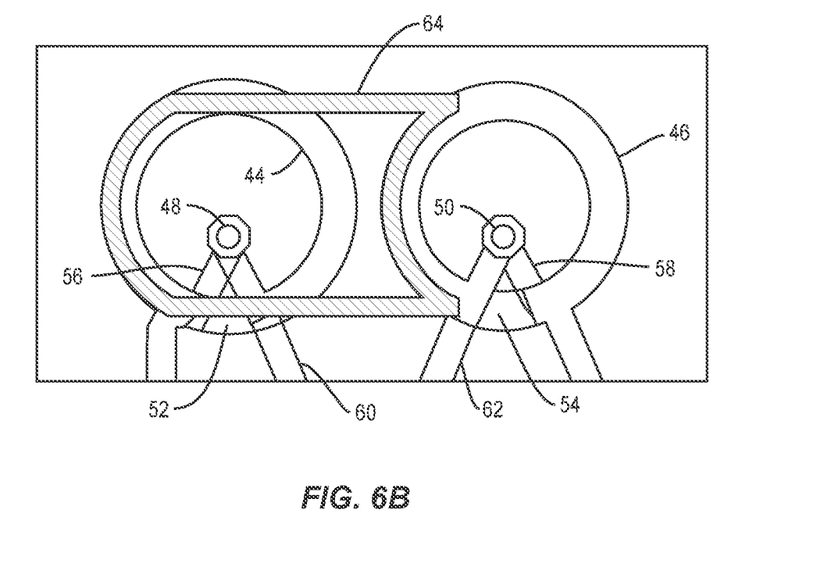
FIG. 6B is a schematic layout of the two adjacent transformers in FIG. 6A with an exemplary decoupling loop, where the decoupling loop is routed directly below the inductors on a different layer of the device according to an exemplary embodiment.

We now refer to FIGS. 6A and 6B, which show another environment in which a decoupling loop may be used. FIG. 6A is a schematic layout of a device having two differential power amplifiers on a single die, where two transformers are located side by side to each other such that there is magnetic coupling between the two transformers. FIG. 6B is a schematic layout of the two adjacent transformers in FIG. 6A with an exemplary decoupling loop, where the decoupling loop is routed directly below the inductors on a different layer of the device, according to an exemplary embodiment.

In one embodiment, a device may have two differential power amplifiers on one die, and the two transformers in the output match may be side by side, similar to FIG. 6A. In FIGS. 6A and 6B, a first transformer 44 and a second transformer 46 may be positioned on the same die. In one embodiment, the first transformer 44 may be associated with a via 48 for connection to other structures in the device (not shown), and the second transformer 46 may be associated with a via 50 for connection to other structures in the device (not shown). In one embodiment, the first transformer 44 may have a portion 52 and the second transformer 46 may have a portion 54 that are on a first different layer than the majority of the first transformer 44 and the second transformer 46, respectively. The first transformer 44 may also have portions 56 and 60, and the second transformer 46 may have portions 58 and 62 that are on a second different layer than the majority of the first transformer 44 and the second transformer 46, respectively. In this regard, the two transformers may use three different layers of the device, in one embodiment.

Referring to FIG. 6A, transformers 44 and 46 may be positioned close enough such that magnetic coupling between the two transformers may create an in-band resonance seen at the collector of one of the power amplifiers. This results in a sharp dip in the probed output loss (see FIG. 7A).

Figure 7A:
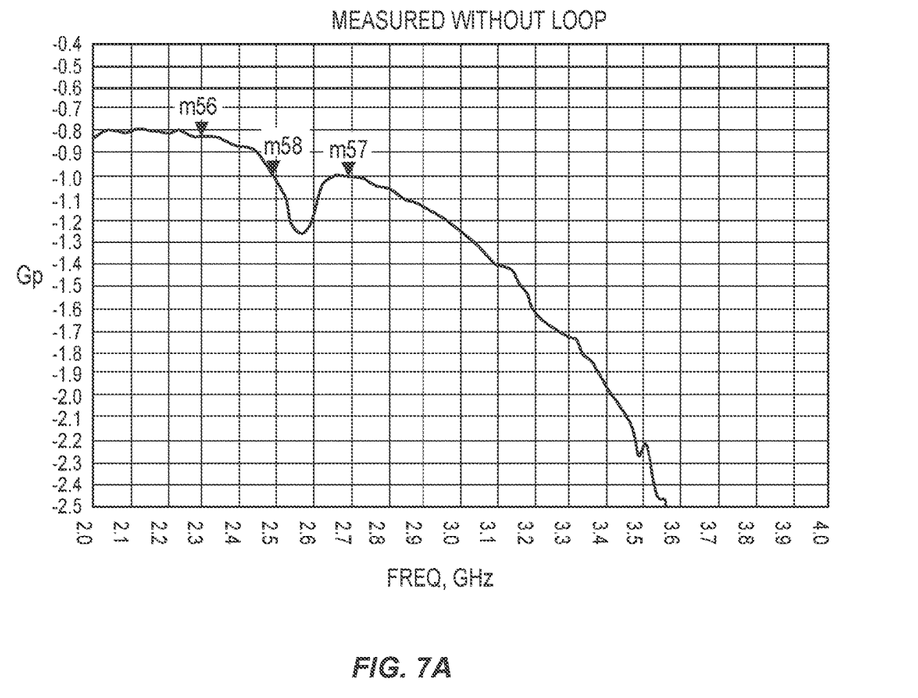
FIG. 7A is a graph that illustrates a measured dip in performance of the two transformers in FIG. 6A without a decoupling loop due to magnetic coupling between the two transformers.

FIG. 7A is a graph that illustrates a measured dip in performance of the two transformers in FIG. 6A without a decoupling loop due to magnetic coupling between the two transformers. In the frequency range of this dip, measured PAE was poor. The problem was accurately duplicated in a simulation (see FIG. 7B).

Figure 7B:
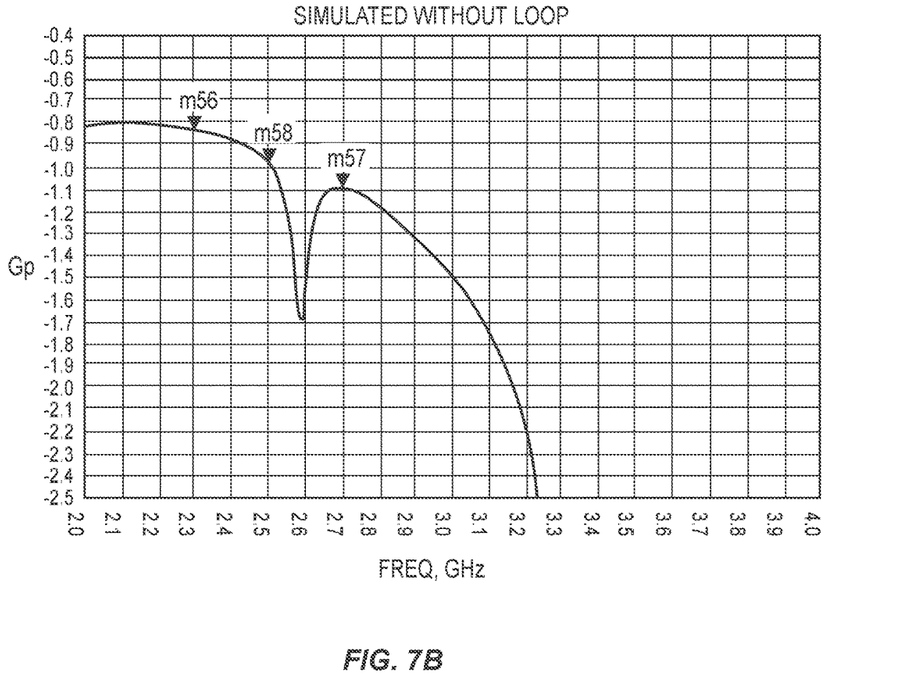
FIG. 7C is a graph that illustrates simulated improved performance of the two transformers with the decoupling loop as shown in FIG. 6B.

FIG. 7B is a graph that illustrates a simulated dip in performance of the two transformers in FIG. 6B without a decoupling loop due to magnetic coupling between the two transformers.

In the embodiment of FIG. 6A, there may not be enough room to increase distance between the two transformers. Thus, a decoupling loop 64 may have to be added, as seen in FIG. 6B. In one embodiment, the decoupling loop 64 may be added on a layer separate from any of the layers on which the two transformers 44, 46 are located. In another embodiment, the decoupling loop 64 may be added adjacent to one or both of the transformers 44, 46 on the same layer as one or both of the transformers 44, 46. Any layer (or multiple layers) can be used for either transformer 44, 46, and the decoupling loop 64 may be above, below, or adjacent to, the transformers 44, 46. In simulation, the decoupling loop 64 significantly decoupled the two transformers 44, 46, resulting in a flattening of the dip in power gain (Gp) (as seen in FIG. 7C).

Figure 7C:
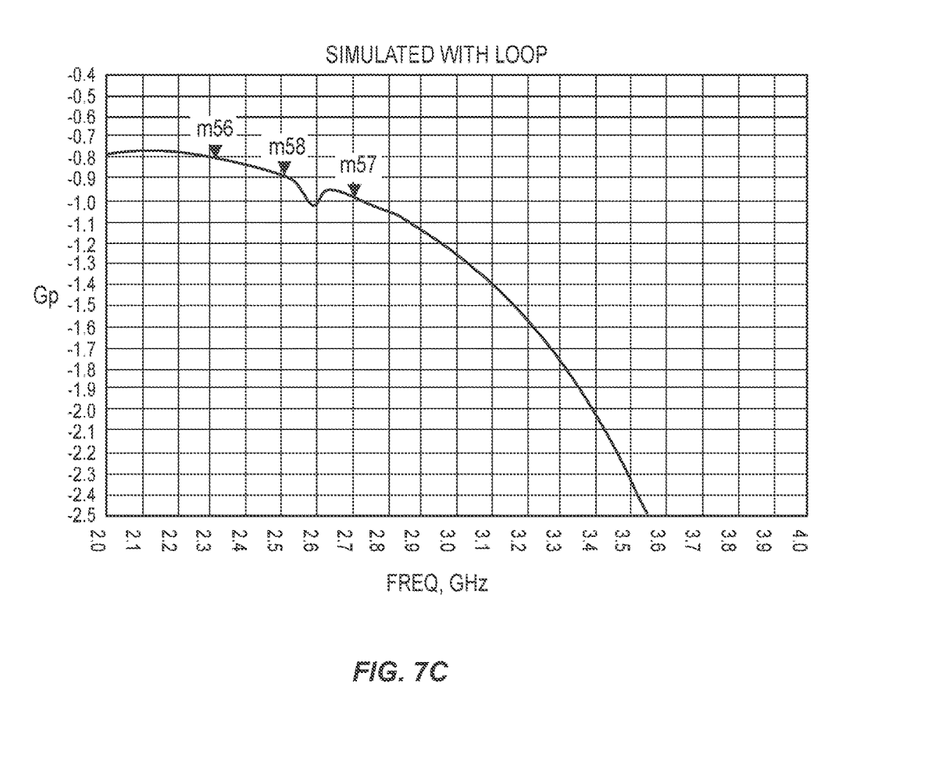

FIG. 7C is a graph that illustrates simulated improved performance of the two transformers with the decoupling loop as shown in FIG. 6B. The simulation indicated that measured efficiency improved considerably in the frequency range of the dip.

Figure 8A:
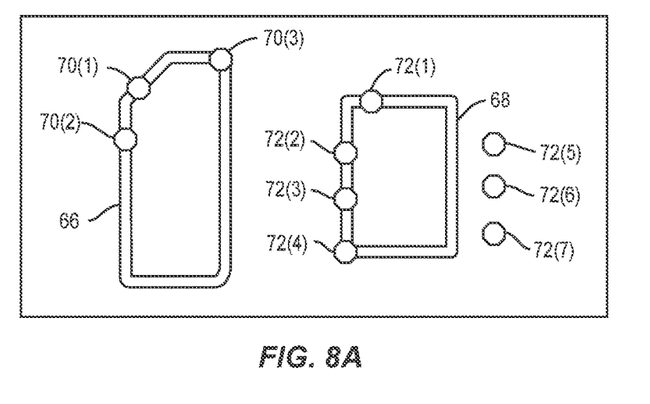
FIG. 8A is a schematic layout of a duplexer with a pair of printed inductors that are close to one another, causing poor interband isolation.
Figure 8B:
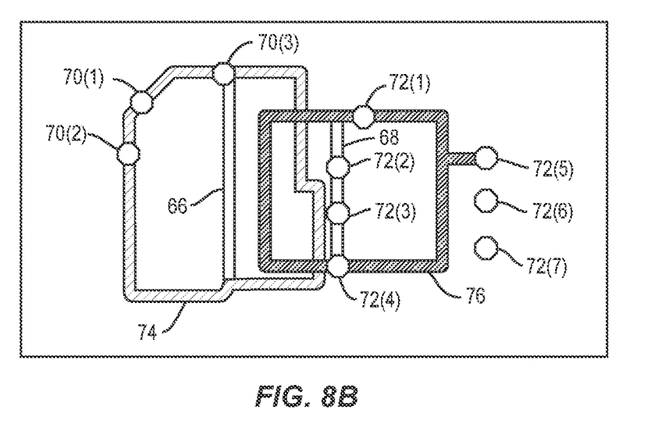
FIG. 8B is a schematic layout of the printed inductors of FIG. 8A with a pair of decoupling loops, where the pair of decoupling loops are on different layers of the device and where one of the decoupling loops is partially on one layer and partially on another layer of the device, according to one exemplary embodiment.
Figure 8C:
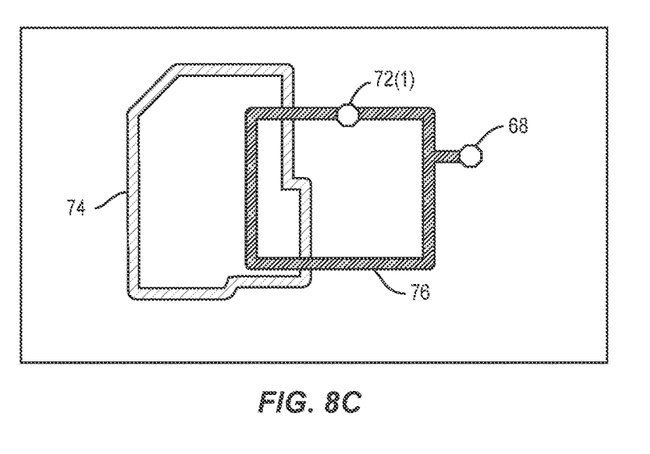
FIG. 8C is schematic layout similar to FIG. 8B but with the printed inductors of FIG. 8A removed so that it is easier to see the routing paths of two exemplary decoupling loops, according to one exemplary embodiment.

FIGS. 8A-8C show another environment in which a decoupling loop may be used. FIG. 8A is a schematic layout of a duplexer with a pair of printed inductors that are close to one another, causing poor interband isolation. In one embodiment, there may be eight duplexers, each with a printed inductor embedded in its die flag for antenna port matching. For example, as shown in FIG. 8A, a first printed inductor 66 and a second printed inductor 68 may be part of a device, such as a duplexer. The first printed inductor 66 may have a plurality of vias 70(1)-70(3) associated with it for connection to other structures in the device (not shown). The second printed inductor 68 may also be part of the duplexer and may have a plurality of vies 72(1)-72(7) associated with it for connection to other structures in the device (not shown). The two printed inductors 66 and 68 may be close to one another, as seen in FIG. 8A, causing poor interband isolation. This is a dense area, making it difficult to add a tightly coupled floating loop as in the foregoing examples. In this case, two decoupling loops 74 and 76 were needed, as seen in FIGS. 8B and 8C. In one embodiment, each of the two decoupling loops 74 and 76 uses a ground layer to complete its path.

FIG. 8B is a schematic layout of the printed inductors of FIG. 8A with a pair of decoupling loops, where the pair of decoupling loops are on different layers of the device and where one of the decoupling loops is partially on one layer and partially on another layer of the device, according to one exemplary embodiment. FIG. 8C is a schematic layout similar to FIG. 8B but with the printed inductors of FIG. 8A removed so that it is easier to see the routing paths of two exemplary decoupling loops, according to one exemplary embodiment.

FIG. 8B highlights the two traces that were added to form decoupling loops 74 and 76. In one embodiment, one of the decoupling loops 74 and 76 may be on a layer above the printed inductors 66 and 68, and the other one of the decoupling loops 74 and 76 may be a layer below the printed inductors 66 and 68. In any event, the decoupling loops 74 and 76 may be on different layers of the device from each other and from the printed inductors 66 and 68. In one embodiment, one of the decoupling loops 74 and 76 routes alongside the first printed inductor 66 and directly beneath most of the second printed inductor 68. One or both of the decoupling loops 74 and 76 may not be able to do a full loop on a single layer, so the decoupling loop may via down to a ground layer to complete the path. One or both of the decoupling loops 74 and 76 may form a conducting loop with the top of one of the printed inductor's die flag.

Figure 9A:
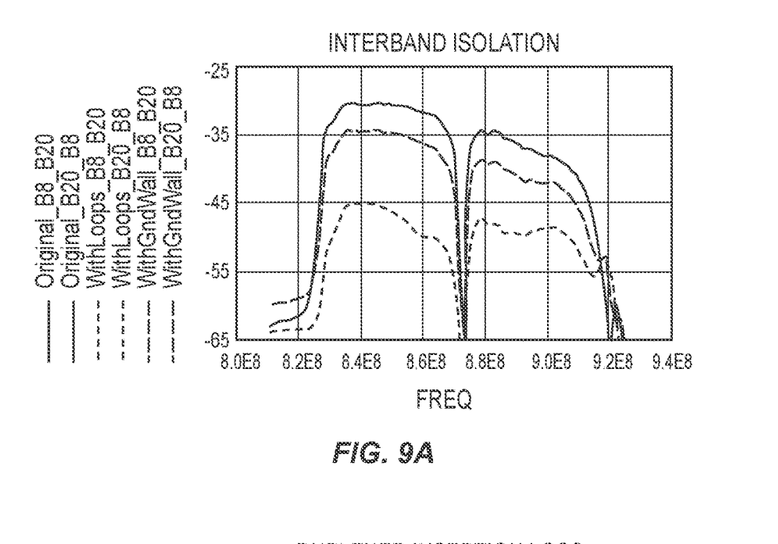
FIG. 9A is a graph that shows interband isolation of the printed inductors of FIG. 8A with and without the exemplary decoupling loops of FIG. 8B, according to one exemplary embodiment.
Figure 9B:
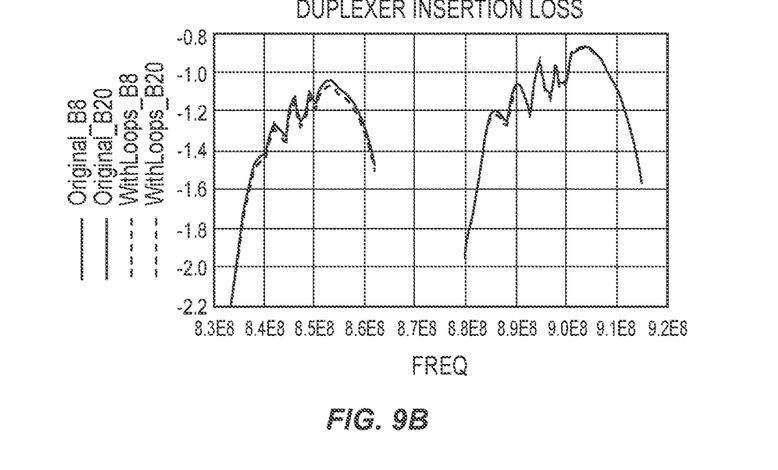
FIG. 9B is a graph that shows insertion loss of the duplexer of FIG. 8A in a schematic layout of the printed inductors of FIG. 8A, according to one exemplary embodiment.
Figure 9C:
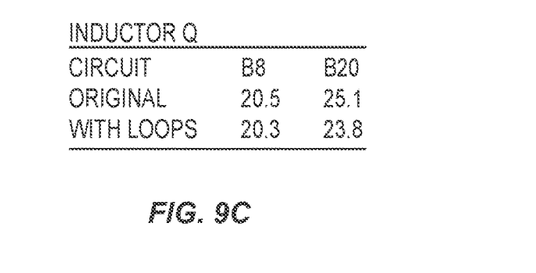
FIG. 9C is a chart that illustrates the changes in quality factor (Q) of the printed inductors of FIG. 8A with and without the exemplary decoupling loops of FIG. 8B, according to one exemplary embodiment.

FIG. 9A is a graph that shows interband isolation of the printed inductors of FIG. 8A with and without the exemplary decoupling loops of FIG. 8B, according to one exemplary embodiment. FIG. 9B is a graph that shows insertion loss of the duplexer of FIG. 8A is a schematic layout of the printed inductors of FIG. 8A, according to one exemplary embodiment. FIG. 9C is a chart that illustrates the changes in quality factor (Q) of the printed inductors of FIG. 8A with and without the exemplary decoupling loops of FIG. 8B, according to one exemplary embodiment.

Simulation shows that the combination of the two decoupling loops 74 and 76 improves isolation by twelve (12) dB or more with little change in insertion loss. FIGS. 9A-9C show isolation, insertion loss, and inductor Q changes. The isolation achieved with a ground wall is also included for comparison.

Embodiments disclosed herein include devices having reduced magnetic coupling between inductors, and related methods. Placing a conducting loop as disclosed herein near closely spaced inductors can decouple inductors effectively. The decoupling loop couples to each inductor and adds an additional coupling path between them, canceling the effects of the direct coupling between the inductors.

These decoupling loops are particularly beneficial to be used with printed inductors. Printed inductors are cheaper and less lossy than surface mounted (SMD) inductors. The printed inductors can also be placed in areas where SMD inductors cannot go. Unfortunately, the larger amount of area the printed inductors occupy often brings them in proximity to one another. By using a current conducting loop as disclosed herein, inductors can be close together without coupling significantly. In most cases, the degradation in inductor Q factor is minor.

In addition to inductors, the decoupling loop may be used to decouple adjacent transformers or routing traces. It may also be possible to decouple SMD inductors by routing a loop beneath them.

Those skilled in the art will recognize improvements and modifications to the present disclosure. All such improvements and modifications are considered within the scope of the concepts disclosed herein.

What is claimed is:

1. A device having reduced magnetic coupling between inductors comprising:
   a first inductor having a first inductance;
   a second inductor having a second inductance, wherein there is an undesired magnetic coupling between the first inductor and the second inductor; and
   a decoupling loop adjacent the first and second inductors, the decoupling loop configured to cancel the undesired magnetic coupling between the first and second inductors, wherein:
   the first inductor is positioned near the second inductor such that a current on the first inductor induces a first induced current on the second inductor; and
   the decoupling loop is positioned with respect to the first and second inductors such that coupling between the decoupling loop and the first inductor induces a decoupling loop current around the decoupling loop and induces a second induced current on the second inductor that is equal and in an opposite direction to the first induced current on the second inductor.

2. The device of claim 1, wherein the decoupling loop is a self-contained current loop.

3. The device of claim 1, wherein the decoupling loop is not physically attached to either the first inductor or the second inductor.

4. The device of claim 1, wherein the decoupling loop is not grounded.

5. The device of claim 1, wherein the first inductor and the second inductor are disposed on a first layer of the device, and the decoupling loop is adjacent one or both of the first inductor and the second inductor and disposed on the first layer.

6. The device of claim 1, wherein the first and second inductors are disposed on a first layer of the device and the decoupling loop is on a different layer of the device than the first layer.

7. The device of claim 6, wherein the decoupling loop is routed directly below at least one of the first and second inductors.

8. The device of claim 1, further comprising a plurality of decoupling loops, wherein the plurality of decoupling loops are configured to cancel the undesired magnetic coupling between the first and second inductors.

9. The device of claim 8, wherein each of a first decoupling loop and a second decoupling loop of the plurality of decoupling loops is positioned with respect to the first and second inductors such that coupling between the first decoupling loop and the first inductor and coupling between the second decoupling loop and the first inductor each induces a decoupling loop current around the respective one of the first and second decoupling loops and jointly induces a second induced current on the second inductor that is equal and in an opposite direction to the first induced current on the second inductor.

10. The device of claim 8, wherein the first and second inductors are disposed on a first layer of the device, and each of the plurality of decoupling loops is on a different layer of the device than the first layer.

11. The device of claim 10, wherein a first one of the plurality of decoupling loops is on a different layer than a second one of the plurality of decoupling loops.

12. The device of claim 10, wherein at least one of the plurality of decoupling loops is routed on more than one layer.

13. The device of claim 1, wherein the first and second inductors are printed inductors.

14. The device of claim 1, wherein the first and second inductors are surface mounted inductors.

15. A power amplifier die having two differential power amplifiers:
   a first transformer;
   a second transformer positioned side by side to the first transformer, wherein there is an undesired magnetic coupling between the first transformer and second transformer; and
   a decoupling loop adjacent the first and second transformers, the decoupling loop configured to cancel the undesired magnetic coupling between the first and second transformers wherein:
      the first transformer is positioned near the second transformer such that a current on the first transformer induces a first induced current on the second transformer; and
      the decoupling loop is positioned with respect to the first and second transformers such that coupling between the decoupling loop and the first transformer induces a decoupling loop current around the decoupling loop and induces a second induced current on the second transformer that is equal and in an opposite direction to the first induced current on the second transformer.

16. A method of reducing undesired magnetic coupling comprising:
   disposing a first inductor having a first inductance on a first layer of a device;
   disposing a second inductor having a second inductance on the first layer, wherein the second inductor is near enough the first inductor that an undesired magnetic coupling is possible between the first inductor and second inductor; and
   placing a decoupling loop adjacent the first and second inductors, wherein the decoupling loop is configured to cancel the undesired magnetic coupling between the first and second inductors, wherein:
      disposing the second inductor on the first layer further comprises disposing the second inductor near enough the first inductor that a current on the first inductor induces a first induced current on the second inductor; and
      placing the decoupling loop adjacent the first and second inductors further comprises placing the decoupling loop with respect to the first and second inductors such that coupling between the decoupling loop and the first inductor induces a decoupling loop current around the decoupling loop and induces a second induced current on the second inductor that is equal and in an opposite direction to the first induced current on the second inductor.

17. The method of claim 16, wherein placing the decoupling loop adjacent the first and second inductors further comprises placing the decoupling loop on a different layer of the device than the first layer.

18. The power amplifier die of claim 15, wherein the first and second transformers are disposed on a first layer of the power amplifier die and the decoupling loop is on a different layer of the power amplifier die than the first layer.

19. The power amplifier die of claim 18, wherein the decoupling loop is routed directly below at least one of the first and second transformers.

20. The method of claim 17, wherein placing the decoupling loop on a different layer of the device than the first layer further comprises placing the decoupling loop directly below at least one of the first and second inductors.

* * * * *

UNITED STATES PATENT AND TRADEMARK OFFICE
CERTIFICATE OF CORRECTION

PATENT NO. : 9,912,307 B2  
APPLICATION NO. : 15/074121  
DATED : March 6, 2018  
INVENTOR(S) : Timothy D. Lewis Page 1 of 1

It is certified that error appears in the above-identified patent and that said Letters Patent is hereby corrected as shown below:

In the Specification

In Column 3, Line 43, replace "FIG. 78" with --FIG. 7B--.

In Column 3, Line 60, replace "FIG. 8C is schematic" with --FIG. 8C is a schematic--.

In Column 6, Line 26, replace "FIG. 26" with --FIG. 2B--.

In Column 9, Line 7, replace "vies 72(1)-72(7)" with --vias 72(1)-72(7)--.

Signed and Sealed this  
Seventeenth Day of April, 2018

Andrei Iancu  
*Director of the United States Patent and Trademark Office*